(12) United States Patent
Campbell et al.

(10) Patent No.: US 9,295,181 B2
(45) Date of Patent: Mar. 22, 2016

(54) COOLANT-CONDITIONING UNIT WITH AUTOMATED CONTROL OF COOLANT FLOW VALVES

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Lagrangeville, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 533 days.

(21) Appl. No.: 13/671,913

(22) Filed: Nov. 8, 2012

(65) Prior Publication Data
US 2014/0124189 A1    May 8, 2014

(51) Int. Cl.
G05D 23/00    (2006.01)
H05K 7/20    (2006.01)
F28F 27/02    (2006.01)

(52) U.S. Cl.
CPC ............ H05K 7/20281 (2013.01); F28F 27/02 (2013.01); H05K 7/20781 (2013.01); H05K 7/20836 (2013.01)

(58) Field of Classification Search
CPC .......... H05K 7/20281; H05K 7/20781; H05K 7/20836; F28F 27/02

USPC .................................. 165/296, 297, 299, 287
See application file for complete search history.

(56) References Cited

U.S. PATENT DOCUMENTS 2,254,917 A    9/1941   Schroder
7,011,143 B2   3/2006   Corrado et al.
(Continued)

FOREIGN PATENT DOCUMENTS

JP    2000-310429 A    7/2000
JP    2011-012904 A    1/2011

OTHER PUBLICATIONS

Campbell et al., Office Action for U.S. Appl. No. 13/782,003, filed Mar. 1, 2013 (U.S. Patent Publication No. 2014/0124190 A1), dated Mar. 12, 2015 (16 pages).
(Continued)

*Primary Examiner* — Marc Norman
*Assistant Examiner* — Jon T Schermerhorn
(74) *Attorney, Agent, or Firm* — Steven Chiu, Esq.; Kevin P. Radigan, Esq.; Heslin Rothenberg Farley & Mesiti P.C.

(57) ABSTRACT

A coolant-conditioning unit is provided which includes a facility coolant path, having a facility coolant flow control valve, and a system coolant path accommodating a system coolant, and having a bypass line with a system coolant bypass valve. A heat exchanger is coupled to the facility and system coolant paths to facilitate transfer of heat from the system coolant to facility coolant in the facility coolant path, and the bypass line is disposed in the system coolant path in parallel with the heat exchanger. A controller automatically controls a regulation position of the coolant bypass valve and a regulation position of the facility coolant flow control valve based on a temperature of the system coolant, and automatically adjusts the regulation position of the system coolant bypass valve to facilitate maintaining the facility coolant flow control valve at or above a specified, partially open, minimum regulation position.

16 Claims, 9 Drawing Sheets

(56) References Cited

U.S. PATENT DOCUMENTS

| | | |
|---|---|---|
| 7,890,215 B2 | 2/2011 | Duncan |
| 9,043,035 B2 | 5/2015 | Chainer et al. |
| 2008/0141703 A1* | 6/2008 | Bean, Jr. .......................... 62/434 |
| 2009/0126910 A1* | 5/2009 | Campbell et al. ......... 165/104.33 |
| 2011/0005741 A1* | 1/2011 | Sheppard ............... F01M 5/007 165/297 |
| 2011/0056675 A1* | 3/2011 | Barringer et al. ............. 165/299 |
| 2012/0127657 A1 | 5/2012 | Keisling et al. |
| 2014/0124190 A1 | 5/2014 | Campbell et al. |

OTHER PUBLICATIONS

Campbell et al., Notice of Allowance for U.S. Appl. No. 13/782,003, filed Mar. 1, 2013 (U.S. Patent Publication No. 2014/0124190 A1), dated Oct. 8, 2015 (6 pages).

* cited by examiner

COOLANT-CONDITIONING UNIT WITH AUTOMATED CONTROL OF COOLANT FLOW VALVES

BACKGROUND

As is known, operating electronic components, such as electronic devices, produce heat. This heat should be removed from the devices in order to maintain device junction temperatures within desirable limits, with failure to remove heat effectively resulting in increased device temperatures, and potentially leading to thermal runaway conditions. Several trends in the electronics industry have combined to increase the importance of thermal management, including heat removal for electronic devices, including technologies where thermal management has traditionally been less of a concern, such as CMOS. In particular, the need for faster and more densely packed circuits has had a direct impact on the importance of thermal management. For example, power dissipation, and therefore heat production, increases as device operating frequencies increase. Also, increased operating frequencies may be possible at lower device junction temperatures. Further, as more and more devices are packed onto a single chip, heat flux (Watts/cm$^2$) increases, resulting in the need to remove more power from a given size chip or module. These trends have combined to create applications where it is no longer desirable to remove heat from modern devices, and electronic system containing such devices, solely by traditional air cooling methods, such as by using air cooled heat sinks with heat pipes or vapor chambers. Such air cooling techniques are inherently limited in their ability to extract heat from electronic components with moderate to high power density. Liquid-cooling of one or more electronic components may be beneficially employed in combination with, or even as a replacement to, conventional air-cooling of electronic components.

BRIEF SUMMARY

A number of issues may arise with a liquid-cooling approach. For instance, a coolant-conditioning unit may be employed to facilitate cooling of system coolant within the liquid-cooled electronic system, and ensure that the system coolant remains in a specified temperature range above, for instance, the room dew point for the data center containing the liquid-cooled electronic system. Such a control facility could be problematic at light or minimal electronic component heat load, as explained further herein.

In one aspect, the shortcomings of the prior art are overcome and additional advantages are provided through the provision of a coolant-conditioning unit which includes a facility coolant path, a system coolant path, a heat exchanger, and a controller. The facility coolant path includes a facility coolant flow control valve, and the system coolant path includes a system coolant, as well as a bypass line with a system coolant bypass valve. The system coolant facilitates cooling of one or more electronic components. The heat exchanger is coupled to the facility coolant path and to the system coolant path, and facilitates transfer of heat from the system coolant of the system coolant path to facility coolant within the facility coolant path. The bypass line is disposed in the system coolant path in parallel with the heat exchanger. The controller automatically controls a regulation position of the system coolant bypass valve and a regulation position of the facility coolant flow control valve based, at least in part, on a temperature of the system coolant. Further, the controller, in part, automatically adjusts the regulation position of the system coolant bypass valve to facilitate maintaining the facility coolant flow control valve at or above a specified, minimum valve regulation position.

In another aspect, a cooled electronic system is provided which includes at least one electronic component, and a coolant-conditioning unit providing system coolant facilitating cooling of the at least one electronic component. The coolant-conditioning unit includes a facility coolant path, a system coolant path, a heat exchanger, and a controller. The facility coolant path includes a facility coolant flow control valve, and the system coolant path includes a system coolant, as well as a bypass line with a system coolant bypass valve. The system coolant facilitates cooling of the one or more electronic components. The heat exchanger is coupled to the facility coolant path and to the system coolant path, and facilitates transfer of heat from the system coolant of the system coolant path to facility coolant within the facility coolant path. The bypass line is disposed in the system coolant path in parallel with the heat exchanger. The controller automatically controls a regulation position of the system coolant bypass valve and a regulation position of the facility coolant flow control valve based, at least in part, on a temperature of the system coolant. Further, the controller, in part, automatically adjusts the regulation position of the system coolant bypass valve to facilitate maintaining the facility coolant flow control valve at or above a specified, minimum valve regulation position.

In a further aspect, a method is provided which includes: providing a coolant-conditioning unit, the coolant-conditioning unit including: a facility coolant path comprising a facility coolant flow control valve; a system coolant path comprising a system coolant, and a bypass line with a system coolant bypass valve, the system coolant facilitating cooling of at least one electronic component; and a heat exchanger coupled to the facility coolant path and to the system coolant path, the heat exchanger facilitating transfer of heat from the system coolant of the system coolant path to facility coolant within the facility coolant path, wherein the bypass line is disposed in the system coolant path in parallel with the heat exchanger; and wherein the providing further includes providing a controller that automatically controls a regulation position of the system coolant bypass valve and a regulation position of the facility coolant flow control valve based, at least in part, on a temperature of the system coolant, and wherein the controller, in part, automatically adjusts the regulation position of the system coolant bypass valve to facilitate maintaining the system coolant flow control valve at or above a specified, minimum valve regulation position.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
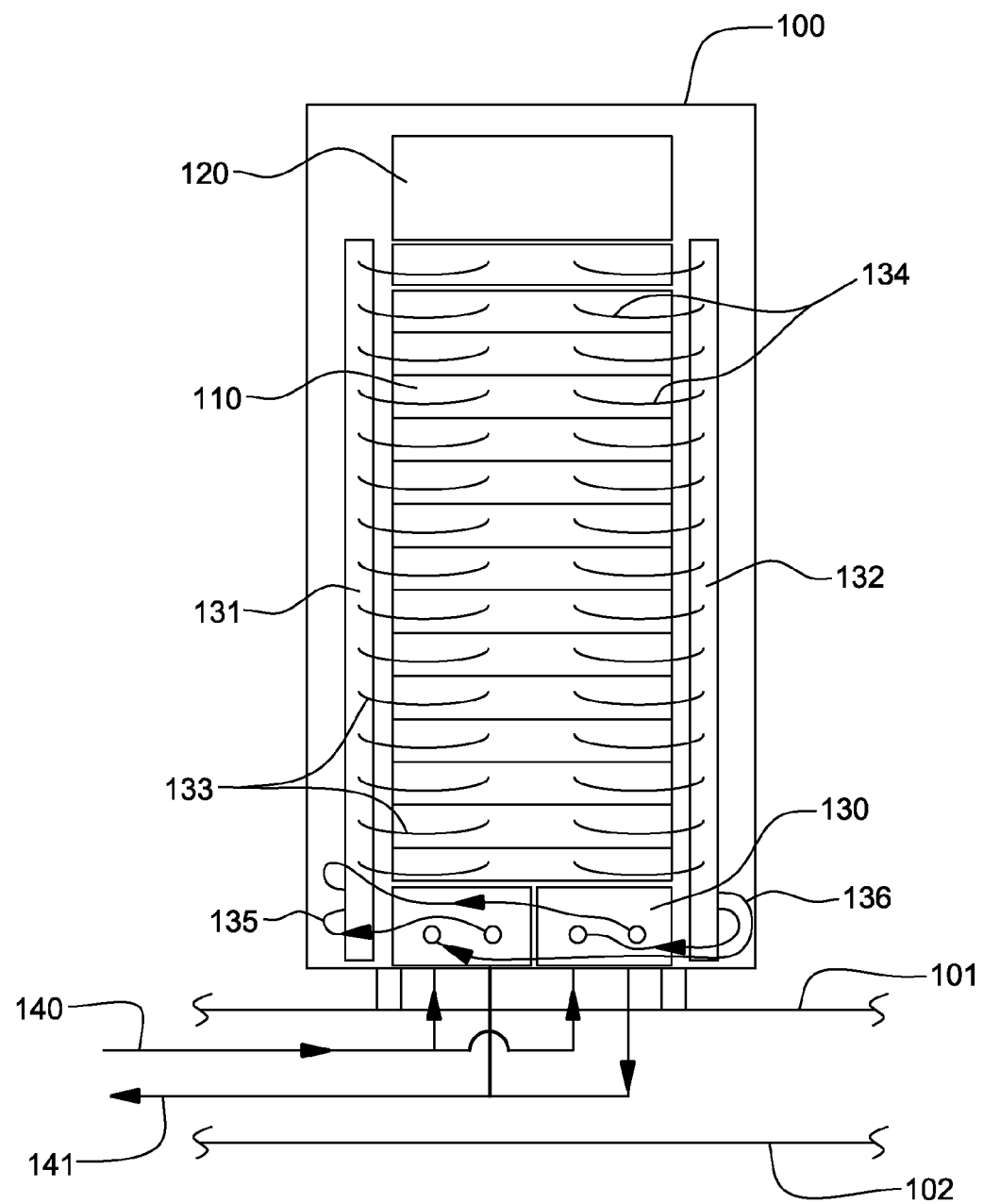
FIG. 1 depicts a front elevational view of one embodiment of a liquid-cooled electronic system or rack comprising multiple liquid-cooled electronic subsystems, in accordance with one or more aspects of the present invention.

As used herein, the terms "electronics rack", and "rack unit" are used interchangeably, and unless otherwise specified include any housing, frame, rack, compartment, blade server system, etc., having one or more heat-generating components of a computer system or electronic system, and may comprise, for example, one or more stand-alone computer processors having high, mid or low end processing capability. In one embodiment, an electronics rack may comprise a portion of an electronic system, a single electronic system or multiple electronic systems, for example, in one or more sub-housings, blades, books, drawers, nodes, compartments, etc., having one or more heat-generating electronic components disposed therein. An electronic system may be movable or fixed, for example, relative to an electronics rack, with rack-mounted electronic drawers and blades of a blade center system being two examples of electronic systems or subsystems of an electronics rack to be cooled. In one embodiment, an electronic system may comprise one or more electronic subsystems and include one or more electronic components of the same or different types, and may be, in one specific example, a server unit.

"Electronic component" refers to any heat-generating electronic component of, for example, a computer system or other electronic system requiring cooling. By way of example, an electronic component may comprise one or more integrated circuit dies, and/or other electronic devices to be cooled, such as one or more electronics cards. In one implementation, an electronics card may comprise a plurality of memory modules (such as one or more dual in-line memory modules (DIMMs)).

Further, as used herein, the terms "coolant-cooled structure", or "coolant-cooled cold plate" refer to structures having one or more channels (or passageways) formed therein or passing therethrough, which facilitate the flow of coolant (such as liquid coolant) through the structure. A coolant-cooled structure may be, for example, a coolant-cooled cold plate, or a coolant-cooled cold rail, or a coolant manifold. In one example, tubing is provided extending through the coolant-cooled structure. A "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Still further, "data center" refers to a computer installation containing one or more electronics racks to be cooled. As a specific example, a data center may comprise one or more rows of rack-mounted computer units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings (which are not drawn to scale for ease of understanding), wherein the same reference numbers used throughout different figures designate the same or similar components.

FIG. 1 depicts one embodiment of a liquid-cooled electronics rack 100, which includes a plurality of electronic systems or subsystems 110 (such as, for instance, processor or server nodes). A bulk power regulator 120 is shown, by way of example only, disposed at an upper portion of liquid-cooled electronics rack 100, and two coolant conditioning units (CCUs) 130 are disposed in a lower portion of the liquid-cooled electronics rack. As one example only, the system coolant within the liquid-cooled electronics rack may be water or an aqueous-based solution.

In addition to CCUs 130, the cooling system includes a system coolant supply manifold 131, a system coolant return manifold 132, and manifold-to-node fluid connect hoses 133 coupling system coolant supply manifold 131 to electronic systems or subsystems 110, and node-to-manifold fluid connect hoses 134 coupling the individual electronic systems or subsystems 110 to system coolant return manifold 132. Each CCU 130 is in fluid communication with system coolant supply manifold 131 via a respective system coolant supply hose 135, and each CCU 130 is in fluid communication with system coolant return manifold 132 via a respective system coolant return hose 136.

As illustrated, heat load of the electronic systems or subsystems 110 is transferred from the system coolant to cooler facility coolant supplied via a facility coolant supply line 140 and a facility coolant return line 141 disposed, in the illustrated embodiment, in the space between a raised floor 101 and a base floor 102.

Figure 2:
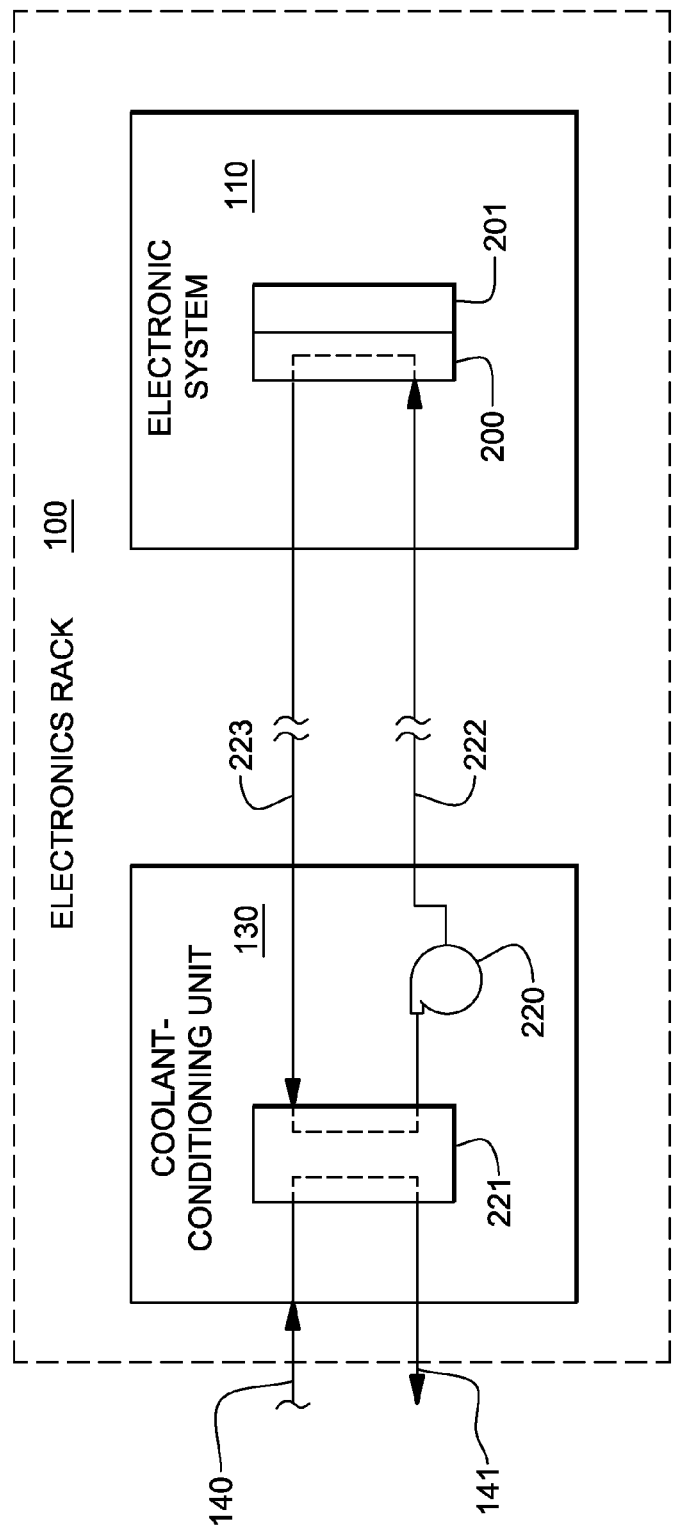
FIG. 2 is a schematic of one embodiment of a liquid-cooled electronics rack, wherein an electronic module of an electronic system is liquid-cooled by a system coolant provided by one or more coolant-conditioning units disposed, for instance, within the liquid-cooled electronics rack, in accordance with one or more aspects of the present invention.

FIG. 2 schematically illustrates operation of the cooling system of FIG. 1, wherein a liquid-cooled cold plate 200 is shown coupled to an electronic module 201 of an electronic system 110 within the liquid-cooled electronics rack 100. Heat is removed from electronic module 201 via system coolant circulated via pump 220 through cold plate 200 of the system coolant path defined through liquid-to-liquid heat exchanger 221 (of coolant conditioning unit 130), system coolant lines 222, 223 and liquid-cooled cold plate 200. The system coolant path and coolant conditioning unit may be designed to provide coolant of a controlled temperature and pressure, as well as controlled chemistry and cleanliness to the electronic module(s). Furthermore, the system coolant is physically separate from the less controlled facility coolant in facility coolant supply and return lines 140, 141, to which heat is ultimately transferred.

Figure 3:
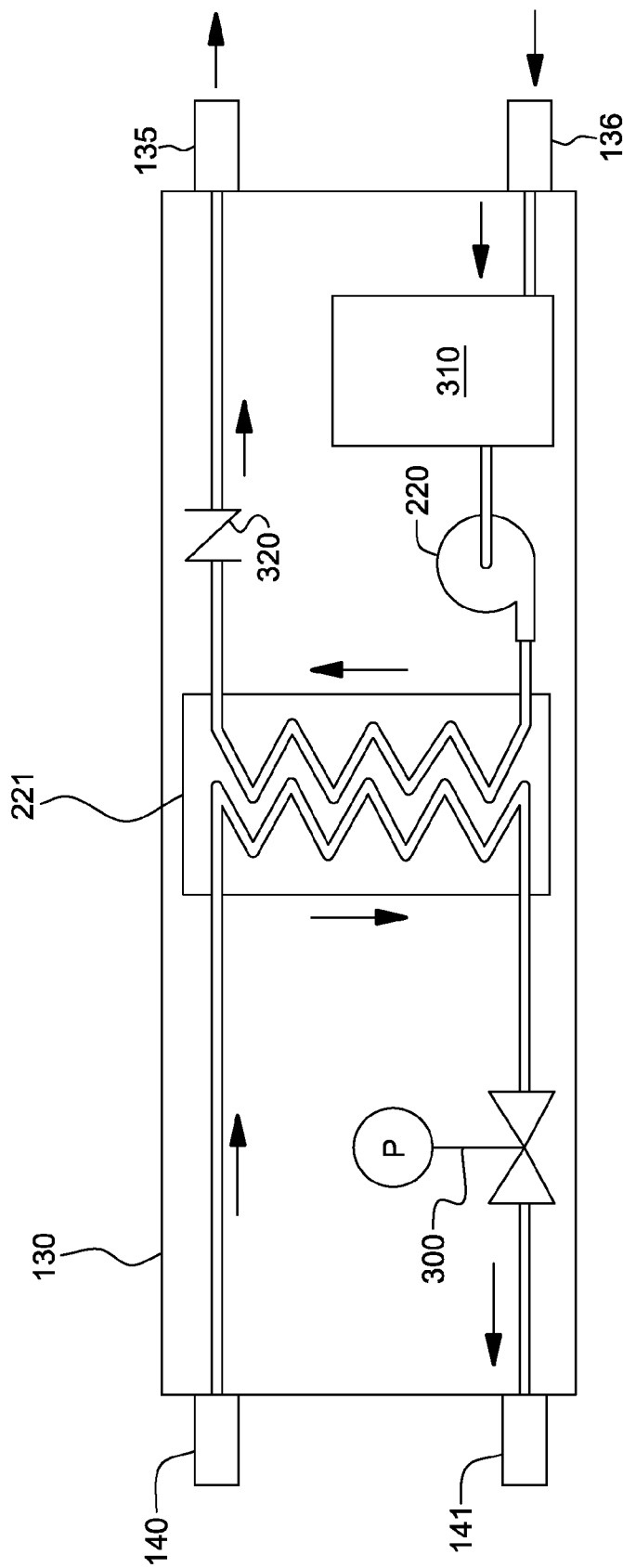
FIG. 3 is a schematic of one embodiment of a coolant-conditioning unit for providing cooled system coolant to a liquid-cooled electronic system, in accordance with one or more aspects of the present invention.

FIG. 3 depicts one embodiment of a coolant-conditioning unit 130. In this example, coolant-conditioning unit 130 includes a facility coolant path, which supplies building-chilled, facility coolant to heat exchanger 221 via supply and return lines 140, 141. The amount of facility coolant supplied to the heat exchanger is controlled by a controller (not shown) via a facility coolant flow control valve 300, such as a two-way proportional valve. In one embodiment, the controller may adjust valve 300 to adjust facility coolant flow through heat exchanger 221 by sensing temperature of system coolant in a system coolant path through the coolant-conditioning unit. For instance, a temperature sensor (not shown) could be associated with a system coolant outlet port coupled to system coolant supply line 135, or alternatively, with a system coolant inlet port coupled to system coolant return line 136 on the system coolant side of the heat exchanger. Additionally, the controller might sense facility coolant temperature as supplied and/or as returning in the facility coolant path through the coolant-conditioning unit. One object of any such implementation is to maintain system coolant temperature within a specified temperature range, for instance, about a specified temperature set point.

As illustrated, the system coolant side of the coolant-conditioning unit 130 further includes a reservoir tank 310 and a system coolant pump 220, which in one embodiment, may comprise a magnetically coupled, centrifugal pump. Although not shown, liquid level sensors may be provided within reservoir tank 310 to monitor level of system coolant. Further, reservoir tank 310 may include a vacuum breaker valve (not shown), and a pressure relief valve (also not shown). A check valve 320 may be provided in the system coolant supply portion of the system coolant path coupled to the system coolant supply line 135. Note that the couplings to the system coolant supply and return hoses may be quick connect couplings, as may be the couplings to the building chilled facility coolant supply and return lines 140, 141.

Figure 4:
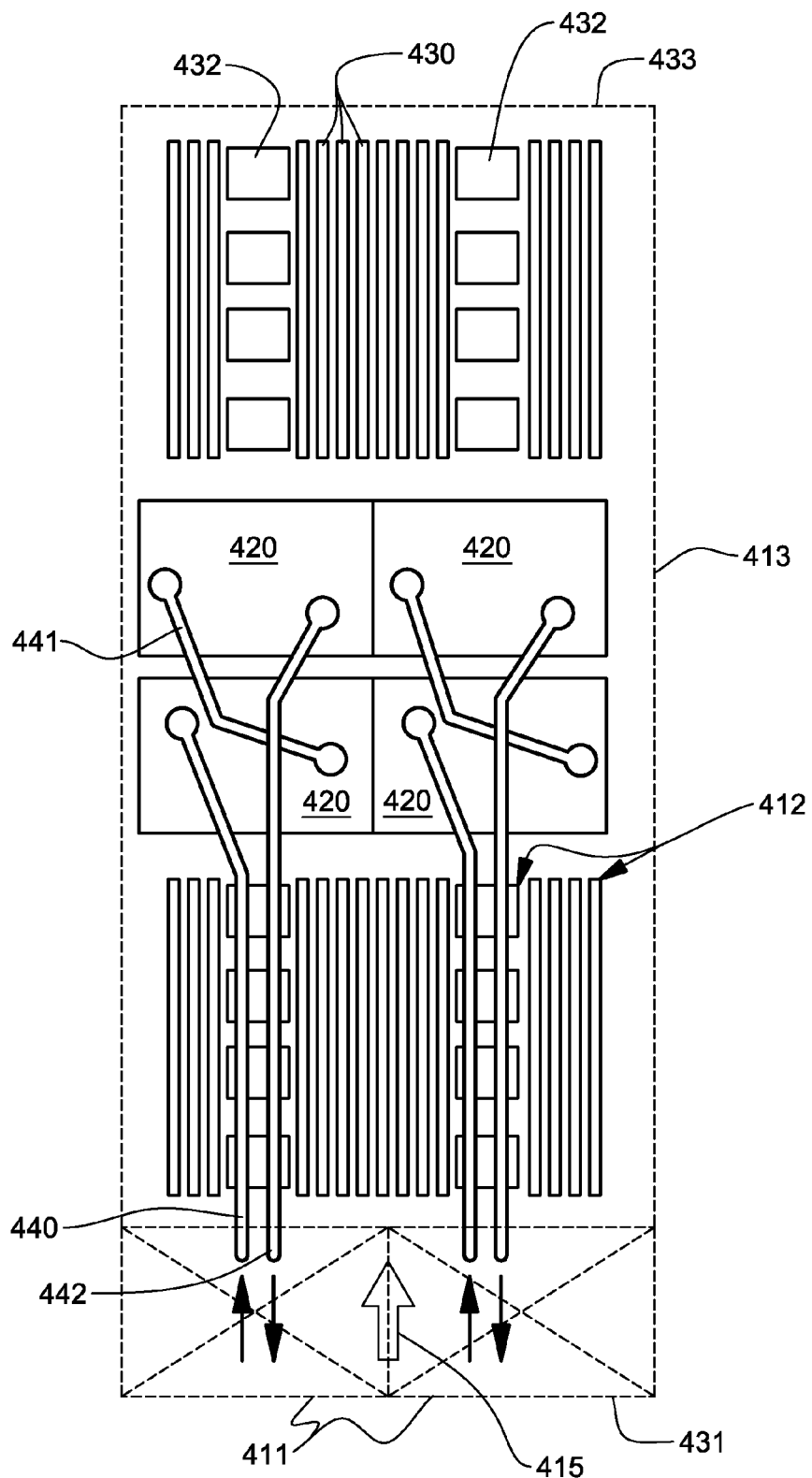
FIG. 4 is a plan view of an electronic system or subsystem layout illustrating an air and liquid-cooling system for cooling components of the electronic system or subsystem, in accordance with one or more aspects of the present invention.

FIG. 4 depicts one embodiment of an electronic system or subsystem 413 layout wherein one or more air moving devices 411 provide forced air flow 415 to cool multiple components 412 within the electronic system 413. Cool air is taken in through a front 431 and exhausted out a back 433 of the drawer. The multiple components to be cooled include multiple processor modules to which liquid-cooled cold plates 420 (of a liquid-based cooling system) are coupled, as well as multiple arrays of memory modules 430 (e.g., dual in-line memory modules (DIMMs)) and multiple rows of memory support modules 432 (e.g., DIMM control modules) to which air-cooled heat sinks are coupled. In the embodiment illustrated, memory modules 430 and the memory support modules 432 are partially arrayed near front 431 of electronic system or subsystem 413, and partially arrayed near back 433 of electronic system or subsystem 413. Also, in the embodiment of FIG. 4, memory modules 430 and the memory support modules 432 are cooled by air flow 415 across the electronic system or subsystem.

The illustrated liquid-based cooling system further includes multiple coolant-carrying tubes connected to and in fluid communication with liquid-cooled cold plates 420. The coolant-carrying tubes comprise sets of coolant-carrying tubes, with each set including (for example) a coolant supply tube 440, a bridge tube 441 and a coolant return tube 442. In this example, each set of tubes provides liquid coolant to a series-connected pair of cold plates 420 (coupled to a pair of processor modules). Coolant flows into a first cold plate of each pair via the coolant supply tube 440 and from the first cold plate to a second cold plate of the pair via bridge tube or line 441, which may or may not be thermally conductive. From the second cold plate of the pair, coolant is returned through the respective coolant return tube 442.

Figure 5:
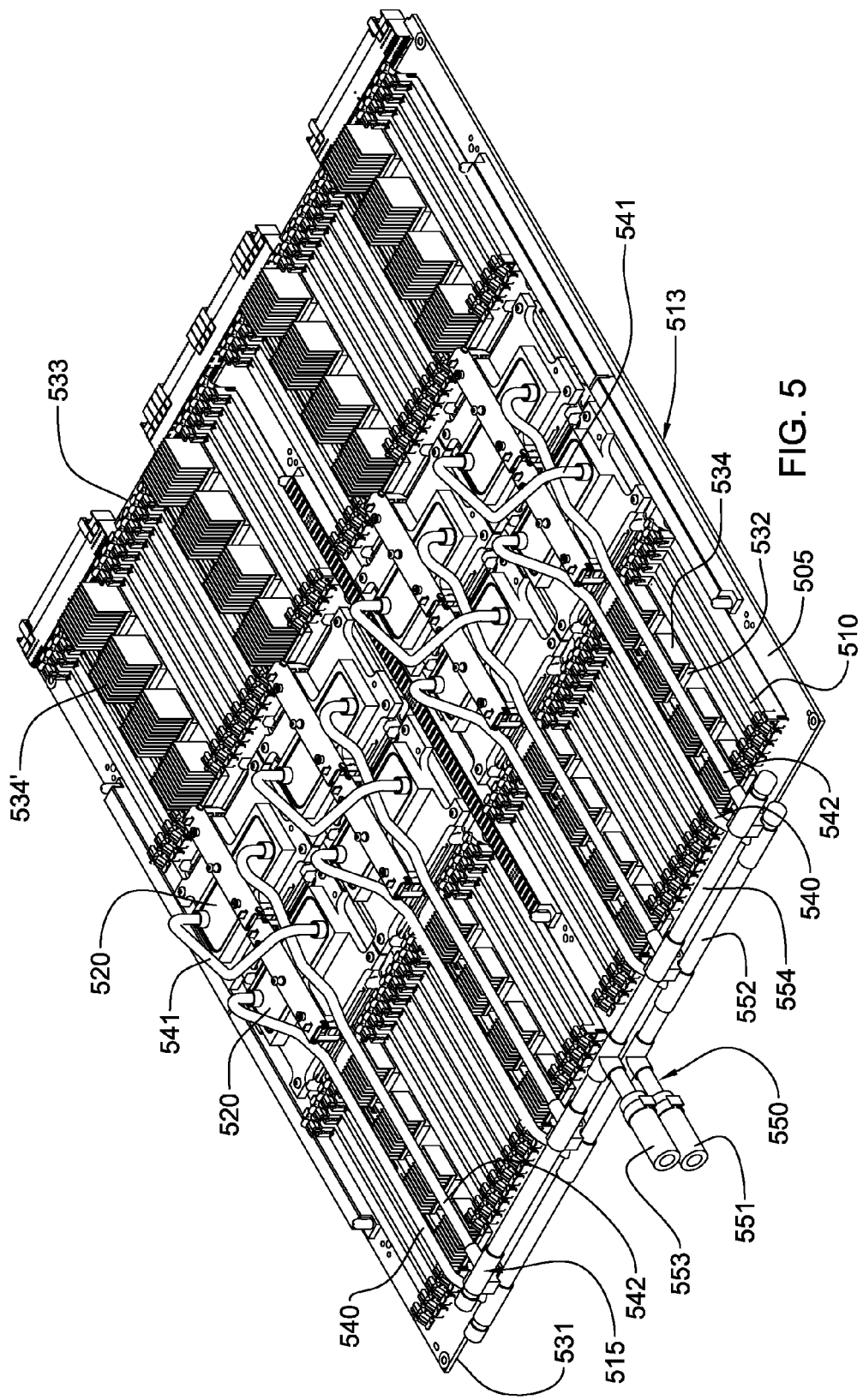
FIG. 5 depicts one detailed embodiment of a partially assembled electronic system or subsystem layout, wherein the electronic system or subsystem includes eight heat-generating electronic components to be actively cooled, each having a respective liquid-cooled cold plate of a liquid-cooling system coupled thereto, in accordance with one or more aspects of the present invention.

FIG. 5 depicts in greater detail an alternate electronic system layout comprising eight processor modules, each having a respective liquid-cooled cold plate of a liquid-based cooling system coupled thereto. The liquid-based cooling system is shown to further include associated coolant-carrying tubes for facilitating passage of liquid coolant through the liquid-cooled cold plates and a header subassembly to facilitate distribution of liquid coolant to and return of liquid coolant from the liquid-cooled cold plates. By way of specific example, the liquid coolant passing through the liquid-based cooling subsystem is chilled water.

As noted, various liquid coolants significantly outperform air in the task of removing heat from heat generating electronic components of an electronic system, and thereby more effectively maintain the components at a desirable temperature for enhanced reliability and peak performance. As liquid-based cooling systems are designed and deployed, it is advantageous to architect systems which maximize reliability and minimize the potential for leaks while meeting all other mechanical, electrical and chemical requirements of a given electronic system implementation. These more robust cooling systems have unique problems in their assembly and implementation. For example, one assembly solution is to utilize multiple fittings within the electronics system, and use flexible plastic or rubber tubing to connect headers, cold plates, pumps and other components. As an alternative, discussed below is a more robust and reliable liquid-based cooling system specially preconfigured and prefabricated as a monolithic structure for positioning within a particular electronic system or subsystem.

FIG. 5 is an isometric view of one embodiment of an electronic system and monolithic cooling system. The depicted planar server assembly includes a multi-layer printed circuit board to which memory DIMM sockets and various electronic components to be cooled are attached both physically and electrically. In the cooling system depicted, a supply header is provided to distribute liquid coolant from a single inlet to multiple parallel coolant flow paths and a return header collects exhausted coolant from the multiple parallel coolant flow paths into a single outlet. Each parallel coolant flow path includes one or more cold plates in series flow arrangement to cool one or more electronic components to which the cold plates are mechanically and thermally coupled. The number of parallel paths and the number of series-connected liquid-cooled cold plates depends, for example, on the desired device temperature, available coolant temperature and coolant flow rate, and the total heat load being dissipated from each electronic component.

More particularly, FIG. 5 depicts a partially assembled electronic system 513 and an assembled liquid-based cooling system 515 coupled to primary heat generating components (e.g., including processor dies) to be cooled. In this embodiment, the electronic system is configured for (or as) an electronics drawer of an electronics rack, and includes, by way of example, a support substrate or planar board 505, a plurality of memory module sockets 510 (with the memory modules (e.g., dual in-line memory modules) not shown), multiple rows of memory support modules 532 (each having coupled thereto an air-cooled heat sink 534), and multiple processor modules (not shown) disposed below the liquid-cooled cold plates 520 of the liquid-based cooling system 515.

In addition to liquid-cooled cold plates 520, liquid-based cooling system 515 includes multiple coolant-carrying tubes, including coolant supply tubes 540 and coolant return tubes 542 in fluid communication with respective liquid-cooled cold plates 520. The coolant-carrying tubes 540, 542 are also connected to a header (or manifold) subassembly 550 which facilitates distribution of liquid coolant to the coolant supply tubes and return of liquid coolant from the coolant return tubes 542. In this embodiment, the air-cooled heat sinks 534 coupled to memory support modules 532 closer to front 631 of electronic system 513 are shorter in height than the air-cooled heat sinks 534' coupled to memory support modules 532 near back 533 of electronic system 513. This size difference is to accommodate the coolant-carrying tubes 540, 542 since, in this embodiment, the header subassembly 550 is at the front 531 of the electronics drawer and the multiple liquid-cooled cold plates 520 are in the middle of the drawer.

Liquid-based cooling system 515 comprises a pre-configured monolithic structure which includes multiple (pre-assembled) liquid-cooled cold plates 520 configured and disposed in spaced relation to engage respective heat generating electronic components. Each liquid-cooled cold plate 520 includes, in this embodiment, a liquid coolant inlet and a liquid coolant outlet, as well as an attachment subassembly (i.e., a cold plate/load arm assembly). Each attachment subassembly is employed to couple its respective liquid-cooled cold plate 520 to the associated electronic component to form the cold plate and electronic component assemblies. Alignment openings (i.e., thru-holes) are provided on the sides of the cold plate to receive alignment pins or positioning dowels during the assembly process. Additionally, connectors (or guide pins) are included within attachment subassembly which facilitate use of the attachment assembly.

As shown in FIG. 5, header subassembly 550 includes two liquid manifolds, i.e., a system coolant supply header 552 and a system coolant return header 554, which in one embodiment, are coupled together via supporting brackets. In the monolithic cooling structure of FIG. 5, the system coolant supply header 552 is metallurgically bonded in fluid communication to each coolant supply tube 540, while the system coolant return header 554 is metallurgically bonded in fluid communication to each coolant return tube 552. A single coolant inlet 551 and a single coolant outlet 553 extend from the header subassembly for coupling to the electronics rack's system coolant supply and return manifolds (not shown).

FIG. 5 also depicts one embodiment of the pre-configured, coolant-carrying tubes. In addition to coolant supply tubes 540 and coolant return tubes 542, bridge tubes or lines 541 are provided for coupling, for example, a liquid coolant outlet of one liquid-cooled cold plate to the liquid coolant inlet of another liquid-cooled cold plate to connect in series fluid flow the cold plates, with the pair of cold plates receiving and returning liquid coolant via a respective set of coolant supply and return tubes. In one embodiment, the coolant supply tubes 540, bridge tubes 541 and coolant return tubes 542 are each pre-configured, semi-rigid tubes formed of a thermally conductive material, such as copper or aluminum, and the tubes are respectively brazed, soldered or welded in a fluid-tight manner to the header subassembly and/or the liquid-cooled cold plates. The tubes are pre-configured for a particular electronics system to facilitate installation of the monolithic structure in engaging relation with the electronics system.

The above-described liquid cooling approach of FIGS. 1-5 is an effective solution for circulating system coolant through liquid-cooled cold plates attached to heat-generating circuit modules (or components). Note, however, that this liquid-cooling approach is presented by way of example only. In the embodiments of FIGS. 1-5, one or more coolant-conditioning units such as described herein, containing a pump and, for example, a liquid-to-liquid heat exchanger, are disposed (by way of example) within the liquid-cooled electronics rack. As explained above, heat load carried by the system coolant circulating through the liquid-cooled components in the liquid-cooled electronics rack is rejected via the liquid-to-liquid heat exchanger(s) of the coolant-conditioning unit to facility coolant passing through the facility coolant path.

As noted above, the controller or control system controls the facility coolant flow control valve in the coolant-conditioning unit embodiment of FIG. 3 to, for instance, automatically maintain system coolant temperature within a specified range about a temperature set point. More specifically, the specified range will be a system coolant temperature range which, in part, ensures system coolant will remain above room dew point. System coolant temperature to the one or more electronic components being liquid-cooled may be regulated by automatically adjusting the facility coolant flow control valve, and thus the flow of facility coolant within the facility coolant path through the liquid-to-liquid heat exchanger. If system coolant temperature increases above a specified upper set point, the facility coolant flow control valve is incrementally opened to increase facility coolant flow through the heat exchanger, and if system coolant temperature decreases below a specified lower set point, then the facility coolant flow control valve is incrementally closed to decrease facility coolant flow through the heat exchanger, and thereby facilitate the desired change in system coolant temperature to bring it back within the specified range.

Figure 6:
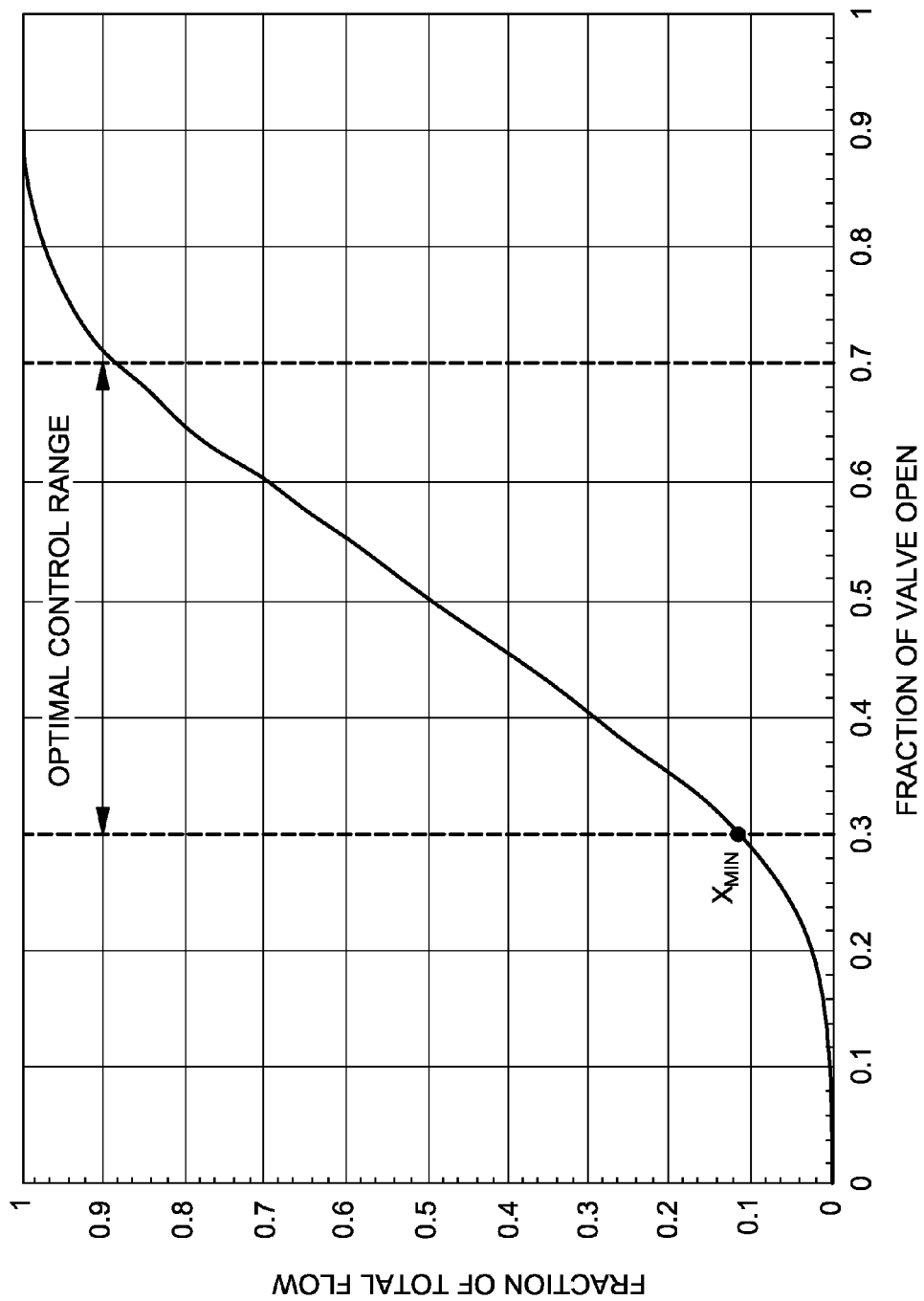
FIG. 6 depicts a graph of fluid flow through a coolant flow control valve versus regulation position of the coolant flow control valve, and illustrates an optimal control range for the coolant flow control valve, in accordance with one or more aspects of the present invention.

One challenge with the above-described coolant-conditioning unit involves its inability to regulate system coolant temperature at very low or no heat load conditions. Such conditions are readily encountered during normal system operation. This challenge is more pronounced the greater the heat transfer capacity of the coolant-conditioning unit. When in a very low or no heat load condition, the controller or control system, in its attempt to maintain system coolant temperature to the electronics within a specified temperature range, may force the facility coolant flow control valve to operate at a nearly closed position. As illustrated in FIG. 6, when the regulation position (X) of a flow control valve drops below a specified, minimum valve regulation position ($X_{min}$), the valve exhibits little or no flow control. Under these conditions, system coolant temperature may fluctuate well outside of the specified set point range, and could possibly lead to under-temperature conditions, which would result in a shutting down of the coolant-conditioning unit for fear of causing condensation within the electronics rack.

To address this issue, disclosed herein is an enhanced coolant-conditioning unit and method of control which maintains a stable system coolant temperature at light or no load conditions in the associated electronic system or electronics rack being cooled. This enhanced coolant-conditioning unit includes a system coolant bypass line in parallel with the liquid-to-liquid heat exchanger of the coolant-conditioning unit, as well as an associated system coolant bypass valve within that bypass line. The bypass line and valve allow a controller or control system to selectively re-circulate warm system coolant when necessary, to require a greater amount of facility coolant flow through the facility coolant path of the coolant-conditioning unit in order to maintain (for instance) the exiting system coolant temperature within the specified temperature range. In this manner, the controller ensures that the facility coolant flow control valve (e.g., the facility coolant proportional valve) operates within its linear (i.e., more optimum) control range above $X_{min}$, such as depicted in FIG. 6, and thereby provides more stable system coolant temperature control.

Generally stated, in accordance with the concepts disclosed herein, a coolant-conditioning unit is provided for facilitating cooling of one or more electronic components of one or more electronic systems of, for instance, an electronics rack. The coolant-conditioning unit includes a facility coolant path, a system coolant path, a heat exchanger, and a controller. The facility coolant path includes a facility coolant flow control valve, and the system coolant path includes a system coolant, as well as a bypass line and a system coolant bypass valve. The system coolant facilitates cooling of the one or more electronic components of an associated electronic system or an electronics rack being at least partially liquid-cooled. The heat exchanger is coupled to the facility coolant path and to the system coolant path, and facilitates transfer of heat from the system coolant within the system coolant path to facility coolant of the facility coolant path. The bypass line is disposed in the system coolant path in parallel with the heat exchanger. The controller is configured to automatically control a regulation position of the coolant bypass valve, and a regulation position of the facility coolant flow control valve based, for instance, on a temperature of the system coolant. In accordance with aspects of the present invention, the controller is, in part, further configured to automatically adjust the regulation position of the system coolant bypass valve to facilitate maintaining the facility coolant flow control valve at or above a specified, minimum regulation position. In this manner, the coolant-conditioning unit may operate to maintain system coolant temperature supplied from the unit within a specified temperature range, as well as to maintain the regulation position of the facility coolant flow control valve above a defined or specified, minimum valve regulation position ($X_{min}$).

Figure 7:
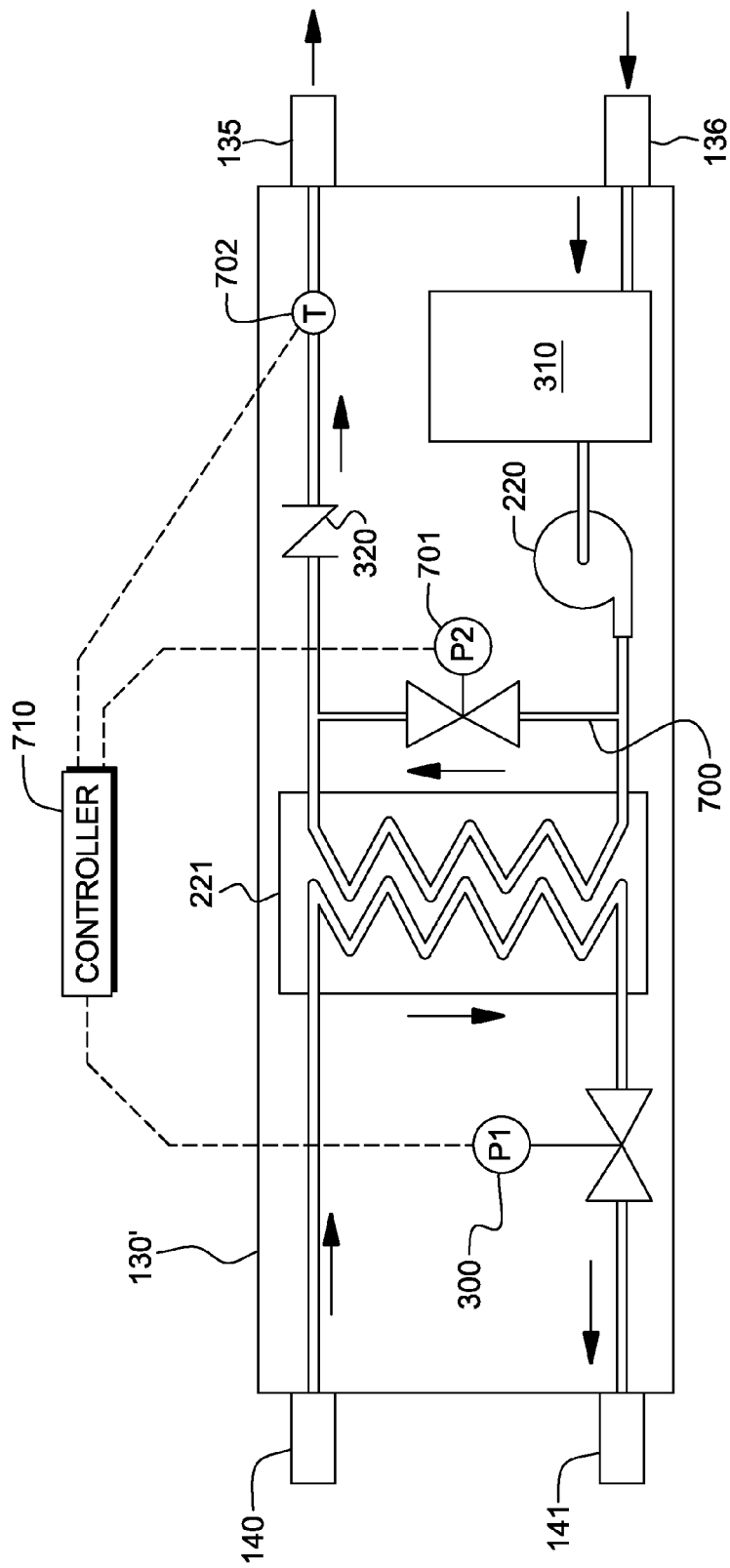
FIG. 7 is a schematic of an alternate embodiment of a coolant-conditioning unit for, for instance, a liquid-cooled electronic system or rack, wherein the unit is configured, in part, to facilitate system coolant bypass flow control and facility coolant flow control in a light-heat-load environment, in accordance with one more aspects of the present invention.

FIG. 7 depicts one embodiment of an enhanced coolant-conditioning unit 130', in accordance with one or more aspects of the present invention. As illustrated, the coolant-conditioning unit 130' is similar to the coolant-conditioning unit depicted in FIG. 3 and described above. In this embodiment, however, a system coolant bypass line 700 is added in parallel fluid communication to liquid-to-liquid heat exchanger 221 on the system coolant side of the coolant-conditioning unit. The bypass line has associated therewith a system coolant bypass valve 701 which (in one embodiment) may comprise an electronic proportional valve, for instance, similar to the facility coolant flow control valve 300 of the facility coolant path on the facility coolant side of the coolant-conditioning unit. (Note that, although depicted as a two-way proportional valve, the system coolant bypass valve 701 could alternatively be a three-way proportional valve, repositioned to one end of the bypass line.) One or more system coolant temperature sensors 702 may be disposed to monitor system coolant temperature, for example, as being supplied to the system coolant supply line 135. If this temperature drops too low, then system coolant can be selectively re-circulated, without experiencing the cooling effect of the liquid-to-liquid heat exchanger 221.

Note with reference to the coolant-conditioning unit 130' embodiment of FIG. 7, that the system coolant pump 220 is oriented (in this implementation) to pump system coolant in the system coolant path towards liquid-to-liquid heat exchanger 221. As illustrated, the system coolant bypass line 700 is disposed in the system coolant path with one end coupled between the system coolant pump 220 and the liquid-to-liquid heat exchanger 221, and the other end disposed between the heat exchanger 221 and the temperature sensor(s) 702. As shown, the system coolant bypass line is disposed in parallel fluid communication with the heat exchanger 221, for instance, is disposed in the system coolant path to extend from upstream to downstream of the heat exchanger.

Figure 8:
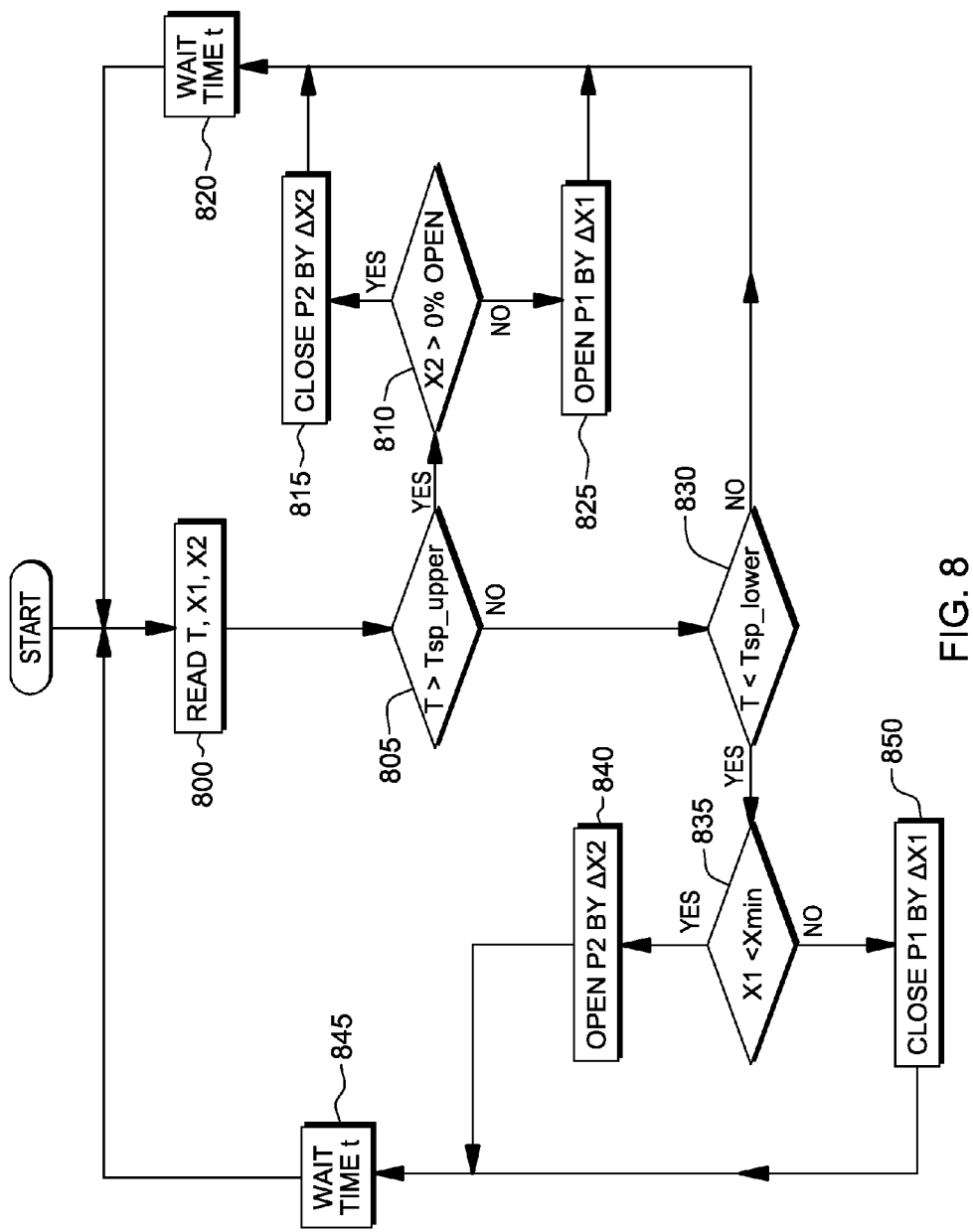
FIG. 8 is a flowchart of one embodiment of a process for automatically controlling a regulation position of a coolant bypass valve and a regulation position of a facility coolant flow control valve within, for instance, a coolant-conditioning unit such as depicted in FIG. 7, in accordance with one or more aspects of the present invention.

FIG. 8 is a flowchart of one embodiment of a process for controlling regulation positions of the facility coolant flow control valve 300 (FIG. 7), and the system coolant bypass valve 700 (FIG. 7), in order to facilitate maintaining temperature of system coolant within a desired temperature range, while also maintaining regulation position of the facility coolant flow control valve at or above a specified, minimum valve regulation position ($X_{min}$). In this process example, the following variables are employed:

TABLE 1

| Variable | Definition |
|---|---|
| T | Regulation temperature. |
| P1 | Facility coolant proportional valve. |
| P2 | System coolant proportional valve. |
| Tsp_upper | Upper limit of the specified temperature set point range. |
| Tsp_lower | Lower limit of the specified temperature set point range. |
| ΔX1 | Incremental change in valve position for valve P1. |
| ΔX2 | Incremental change in valve position for valve P2. |
| $X_{min}$ | Minimum specified valve regulation position. |
| t | Time interval. |

The control process starts by sensing or reading a temperature T of the system coolant, as well as regulation positions X1, X2 of the facility coolant supply control valve and the system coolant bypass valve, respectively 800. Valve position (or regulation position) is currently available or recorded as a feature on many commercially available proportional valves. The control system initially determines whether the system coolant temperature (T) is greater than a specified upper temperature (Tsp_upper), representing the specified upper bound of system coolant temperature regulation, for instance, taking tolerances into account 805. If system coolant temperature is above the specified upper bound, then a check is made to determine whether the regulation position X2 of the system coolant bypass valve P2 is greater than 0% open 810, meaning that the system coolant bypass valve is at least partially open and allowing system coolant to flow through the bypass line coupled in parallel with the liquid-to-liquid heat exchanger of the coolant-conditioning unit. This can be accomplished by checking the valve or regulation position of the system coolant bypass valve to determine whether it is greater than 0% open (i.e., greater than zero). If not, then the facility coolant flow control valve (P1) is opened by an incremental amount (ΔX1) 825, after which processing waits a time interval t 820 before again reading the system coolant temperature T and regulation positions X1, X2 of the facility coolant flow control valve and system coolant bypass valve 800. If the system coolant bypass valve is open 810, then processing closes the system coolant bypass valve P2 by an incremental amount (ΔX2) 815, before waiting time interval t 820, and again reading the temperature and regulation positions of the flow control and bypass valves 800.

Assuming that the system coolant temperature is not above the specified upper bound 805, then processing determines whether the system coolant temperature is below a lower specified temperature (Tsp_lower) 830, representing a specified lower bound for system coolant temperature regulation, again taking tolerances into account. If the system coolant temperature is not below the lower bound, then the system coolant temperature is within its regulation range, and no valve adjustments are currently made. Processing waits the prescribed time interval t 820 before again repeating the process.

If, however, system coolant temperature is below the specified lower temperature bound (Tsp_lower), then processing checks to determine whether the regulation position (X1) of the facility coolant flow control valve 300 (FIG. 7) is outside its optimum control range by determining whether the regulation position is below a specified, minimum valve regulation position ($X_{min}$) 835. If the valve position is below the specified minimum regulation position ($X_{min}$), then the system coolant bypass valve (P2) is opened by an incremental amount (ΔX2) 840, after which processing waits a time interval t 845 before repeating the process. If the regulation position (X1) of the facility coolant flow control valve is at or above the specified minimum valve regulation position ($X_{min}$) 835, then processing closes the facility coolant flow control valve (P1) by an incremental amount (ΔX1) 850. The process then repeats after waiting the prescribed time interval t 845.

With the above coolant-conditioning unit and valve control processing, a mechanism is presented to selectively re-circulate warm system coolant when necessary, to raise the system coolant temperature (e.g., at sensor 702 (FIG. 7)) in order to maintain (for instance) the system coolant temperature within a specified temperature range. In this manner, the controller ensures that the facility coolant flow control valve will operate within its linear (i.e., more optimum) control range.

As will be appreciated by one skilled in the art, one or more control aspects of the present invention may be embodied as a system, method or computer program product. Accordingly, one or more control aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more control aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 9:
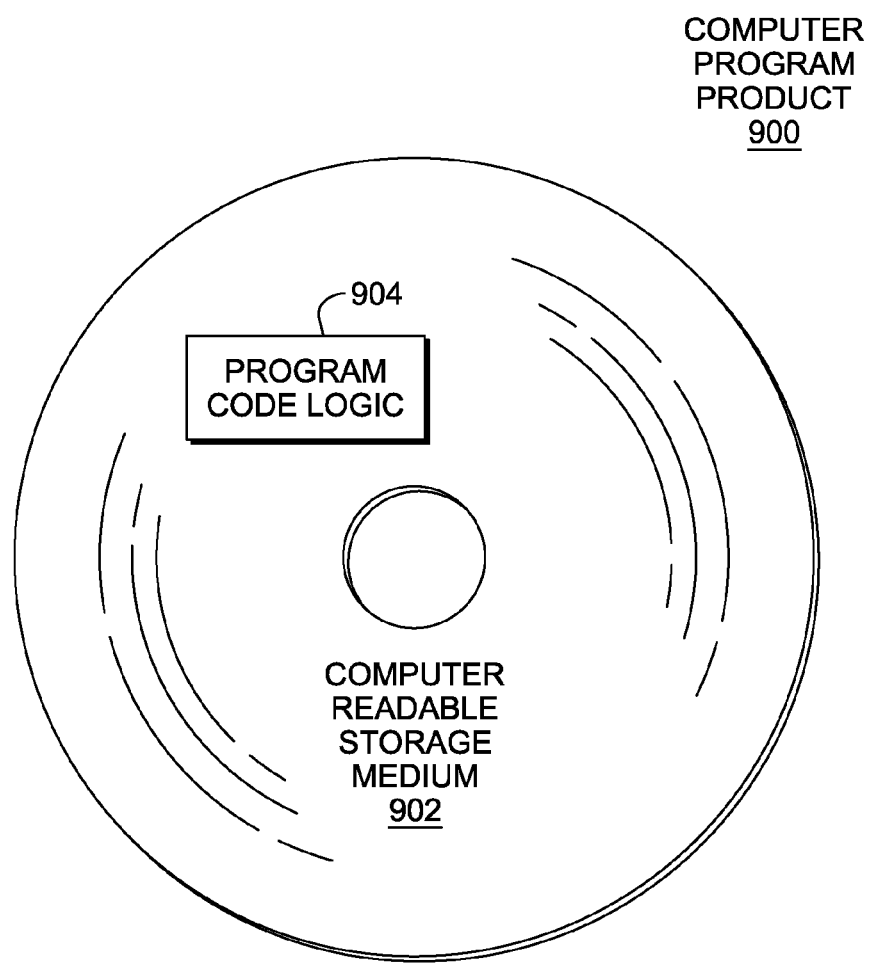
FIG. 9 depicts one embodiment of a computer program product incorporating one or more aspects of the present invention.

Referring now to FIG. 9, in one example, a computer program product 900 includes, for instance, one or more non-transitory computer readable storage media 902 to store computer readable program code means or logic 904 thereon to provide and facilitate one or more control aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more control aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more control aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more control aspects of the present invention may be provided, offered, deployed, managed, serviced, etc. by a service provider who offers management of customer environments. For instance, the service provider can create, maintain, support, etc. computer code and/or a computer infrastructure that performs one or more control aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more control aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A coolant-conditioning unit comprising:
    a facility coolant path comprising a facility coolant flow control valve;
    a system coolant path comprising a system coolant, the system coolant facilitating cooling of at least one electronic component;
    a bypass line coupled in fluid communication with the system coolant path, the bypass line comprising a system coolant bypass valve;
    a heat exchanger coupled to the facility coolant path and to the system coolant path, the heat exchanger facilitating transfer of heat from the system coolant of the system coolant path to facility coolant within the facility coolant path, wherein the bypass line couples to the system coolant path in parallel with the heat exchanger, directly between an inlet and an outlet of the heat exchanger;
    a system coolant pump associated with the system coolant path and facilitating flow of the system coolant through the system coolant path, one end of the bypass line being coupled in fluid communication with the system coolant path between the system coolant pump and the heat exchanger; and a controller to automatically control a regulation position of the system coolant bypass valve based, at least in part, on a temperature of the system coolant and a regulation position of the facility coolant flow control valve, and wherein the controller, in part, automatically adjusts the regulation position of the system coolant bypass valve to selectively raise temperature of the system coolant circulating through the system coolant path to facilitate maintaining the facility coolant flow control valve at or above a specified, minimum valve regulation position, the specified, minimum valve regulation position of the facility coolant flow control valve being a specified, partially-open regulation position.

2. The coolant-conditioning unit of claim 1, wherein based on the temperature of the system coolant being at or below a lower set point temperature, and based on the facility coolant flow control valve being at or below the specified, minimum valve regulation position, the controller automatically, incrementally adjusts flow of system coolant through the bypass line of the system coolant path to decrease system coolant flow through the heat exchanger.

3. The coolant-conditioning unit of claim 2, wherein based on the temperature of the system coolant being at or below the lower set point temperature, and based on the facility contain flow control valve being above the specified, minimum valve regulation position, the controller automatically, incrementally adjusts flow of facility coolant through the facility coolant flow control valve to decrease facility coolant flow through the heat exchanger.

4. The coolant-conditioning unit of claim 1, wherein based on the temperature of the system coolant being at or above an upper set point temperature, and the system coolant bypass valve being at least partially open, the controller automatically, incrementally adjusts the system coolant bypass valve to decrease flow of system coolant through the bypass line, and thereby, increase flow of system coolant through the heat exchanger.

5. The coolant-conditioning unit of claim 4, wherein based on the temperature of the system coolant being at or above the upper set point temperature, and the system coolant bypass valve being closed, the controller automatically, incrementally adjusts the facility coolant flow control valve to increase flow of facility coolant through the heat exchanger.

6. The coolant-conditioning unit of claim 1, wherein the controller, in part, automatically adjusts the regulation position of the system coolant bypass valve to facilitate maintaining the facility coolant flow control valve at or above the specified, minimum valve regulation position during a low-heat-load state of the at least one electronic component cooled, at least in part, by the system coolant of the system coolant path.

7. The coolant-conditioning unit of claim 1, wherein the specified, partially-open regulation position is in a range of 10% to 30% open.

8. A cooled electronic system comprising:
at least one electronic component; and
a coolant-conditioning unit providing system coolant facilitating cooling the at least one electronic component, the coolant-conditioning unit comprising:
a facility coolant path comprising a facility coolant flow control valve;
a system coolant path comprising the system coolant;
a bypass line coupled in fluid communication with the system coolant path, the bypass line comprising a system coolant bypass valve;
a heat exchanger coupled to the facility coolant path and to the system coolant path, the heat exchanger facilitating transfer of heat from the system coolant of the system coolant path to facility coolant within the facility coolant path, wherein the bypass line is disposed in the system coolant path in parallel with the heat exchanger directly between an inlet and an outlet of the heat exchanger;
a system coolant pump associated with the system coolant path and facilitating flow of the system coolant through the system coolant path, one end of the bypass line being coupled in fluid communication with the system coolant path between the system coolant pump and the heat exchanger; and
a controller to automatically control a regulation position of the system coolant bypass valve based, at least in part, on a temperature of the system coolant and a regulation position of the facility coolant flow control valve, and wherein the controller, in part, automatically adjusts the regulation position of the system coolant bypass valve to selectively raise temperature of the system coolant circulating through the system coolant path to facilitate maintaining the facility coolant flow control valve at or above a defined, minimum valve regulation position, the specified, minimum valve regulation position of the facility coolant flow control valve being a specified, partially-open regulation position.

9. The cooled electronic system of claim 8, wherein based on the temperature of the system coolant being at or below a lower set point temperature, and based on the facility coolant flow control valve being at or below the specified, minimum valve regulation position, the controller automatically, incrementally adjusts flow of system coolant through the bypass line of the system coolant path to decrease system coolant flow through the heat exchanger.

10. The cooled electronic system of claim 9, wherein based on the temperature of the system coolant being at or below the lower set point temperature, and based on the facility coolant flow control valve being above the specified, minimum valve regulation position, the controller automatically, incrementally adjusts flow of facility coolant through the facility coolant flow control valve to decrease facility coolant flow through the heat exchanger.

11. The cooled electronic system of claim 8, wherein based on the temperature of the system coolant being at or above an upper set point temperature, and the system coolant bypass valve being at least partially open, the controller automatically, incrementally adjusts the system coolant bypass valve to decrease flow of system coolant through the bypass line, and thereby, increase flow of system coolant through the heat exchanger.

12. The cooled electronic system of claim 11, wherein based on the temperature of the system coolant being at or above the upper set point temperature, and the system coolant bypass valve being closed, the controller automatically, incrementally adjusts the facility coolant flow control valve to increase flow of facility coolant through the heat exchanger.

13. The cooled electronic system of claim 8, wherein the controller, in part, automatically adjusts the regulation position of the system coolant bypass valve to facilitate maintaining the facility coolant flow control valve at or above the specified, minimum valve regulation position during a low-heat-load state of the at least one electronic component cooled, at least in part, by the system coolant of the system coolant path.

14. The cooled electronic system of claim 8, wherein the specified, partially open, regulation position is in a range of 10% to 30% open.

15. The coolant-conditioning unit of claim 1, wherein the system coolant path comprises a check valve, and another end of the bypass line is coupled in fluid communication with the system coolant path between the heat exchanger and the check valve.

16. The cooled electronic system of claim 8, wherein the system coolant path comprises a check valve, and another end of the bypass line is coupled in fluid communication with the system coolant path between the heat exchanger and the check valve.

* * * * *